US012618157B2

(12) United States Patent
Katono et al.

(10) Patent No.: US 12,618,157 B2
(45) Date of Patent: May 5, 2026

(54) FILM FORMING APPARATUS, AND METHOD OF MANUFACTURING SEMICONDUCTOR DEVICE

(71) Applicant: Kioxia Corporation, Tokyo (JP)

(72) Inventors: Kazuhiro Katono, Yokkaichi Mie (JP); Kazuhiro Matsuo, Kuwana Mie (JP); Yusuke Miki, Yokkaichi Mie (JP); Kenichiro Toratani, Yokkaichi Mie (JP); Akifumi Gawase, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 358 days.

(21) Appl. No.: 18/332,117

(22) Filed: Jun. 9, 2023

(65) Prior Publication Data

US 2024/0084456 A1 Mar. 14, 2024

(30) Foreign Application Priority Data

Sep. 13, 2022 (JP) ................................. 2022-145351

(51) Int. Cl.
| | |
|---|---|
| *C23C 16/52* | (2006.01) |
| *C23C 16/455* | (2006.01) |
| *H01L 21/02* | (2006.01) |
| *H01L 21/66* | (2006.01) |

(52) U.S. Cl.
CPC ........ *C23C 16/52* (2013.01); *C23C 16/45565* (2013.01); *H01L 21/0262* (2013.01); *H01L 22/20* (2013.01)

(58) Field of Classification Search
CPC .............. C23C 16/45565; C23C 16/52; H01L 21/0262
See application file for complete search history.

(56) References Cited

U.S. PATENT DOCUMENTS

| | | |
|---|---|---|
| 10,541,170 B2 | 1/2020 | Yahata et al. |
| 2012/0137973 A1* | 6/2012 | Sato ........................ C23C 16/54 118/719 |
| 2013/0045548 A1 | 2/2013 | Käppeler et al. |
| 2020/0024739 A1* | 1/2020 | Roberts .................. C23C 16/52 |
| 2021/0156027 A1 | 5/2021 | Terasaka et al. |
| 2021/0287922 A1 | 9/2021 | Matsuda et al. |
| 2021/0301942 A1 | 9/2021 | Matsuda et al. |

FOREIGN PATENT DOCUMENTS

| | | |
|---|---|---|
| JP | 2013-55165 A | 3/2013 |
| JP | 2019-161071 A | 9/2019 |
| JP | 2021-86358 A | 6/2021 |
| JP | 2021-145007 A | 9/2021 |
| JP | 2021-152705 A | 9/2021 |
| JP | 2021-195595 A | 12/2021 |

* cited by examiner

*Primary Examiner* — Robert J May
(74) *Attorney, Agent, or Firm* — Finnegan, Henderson, Farabow, Garrett & Dunner, LLP

(57) ABSTRACT

In one embodiment, a film forming apparatus includes a chamber configured to load a substrate, a stage configured to support the substrate, and a gas supplier configured to supply a gas into the chamber to form a film on the substrate. The device further includes a first detector configured to detect a first value that varies depending on at least pressure of a first portion above the stage in the chamber, and a controller configured to control a process of forming the film on the substrate based on the first value.

16 Claims, 6 Drawing Sheets

FILM FORMING APPARATUS, AND METHOD OF MANUFACTURING SEMICONDUCTOR DEVICE

CROSS REFERENCE TO RELATED APPLICATION

This application is based upon and claims the benefit of priority from the prior Japanese Patent Application No. 2022-145351, filed on Sep. 13, 2022, the entire contents of which are incorporated herein by reference.

FIELD

Embodiments described herein relate to a film forming apparatus, and a method of manufacturing a semiconductor device.

BACKGROUND

When a film is formed on a substrate using a film forming apparatus such as a CVD (Chemical Vapor Deposition) apparatus, it is desirable that the internal state of a chamber that loads the substrate can be detected with high accuracy.

DETAILED DESCRIPTION

Embodiments will now be explained with reference to the accompanying drawings. In FIGS. 1 to 6B, identical components are denoted by identical reference signs, and overlapped description will be omitted.

In one embodiment, a film forming apparatus includes a chamber configured to load a substrate, a stage configured to support the substrate, and a gas supplier configured to supply a gas into the chamber to form a film on the substrate. The device further includes a first detector configured to detect a first value that varies depending on at least pressure of a first portion above the stage in the chamber, and a controller configured to control a process of forming the film on the substrate based on the first value.

First Embodiment

Figure 1:
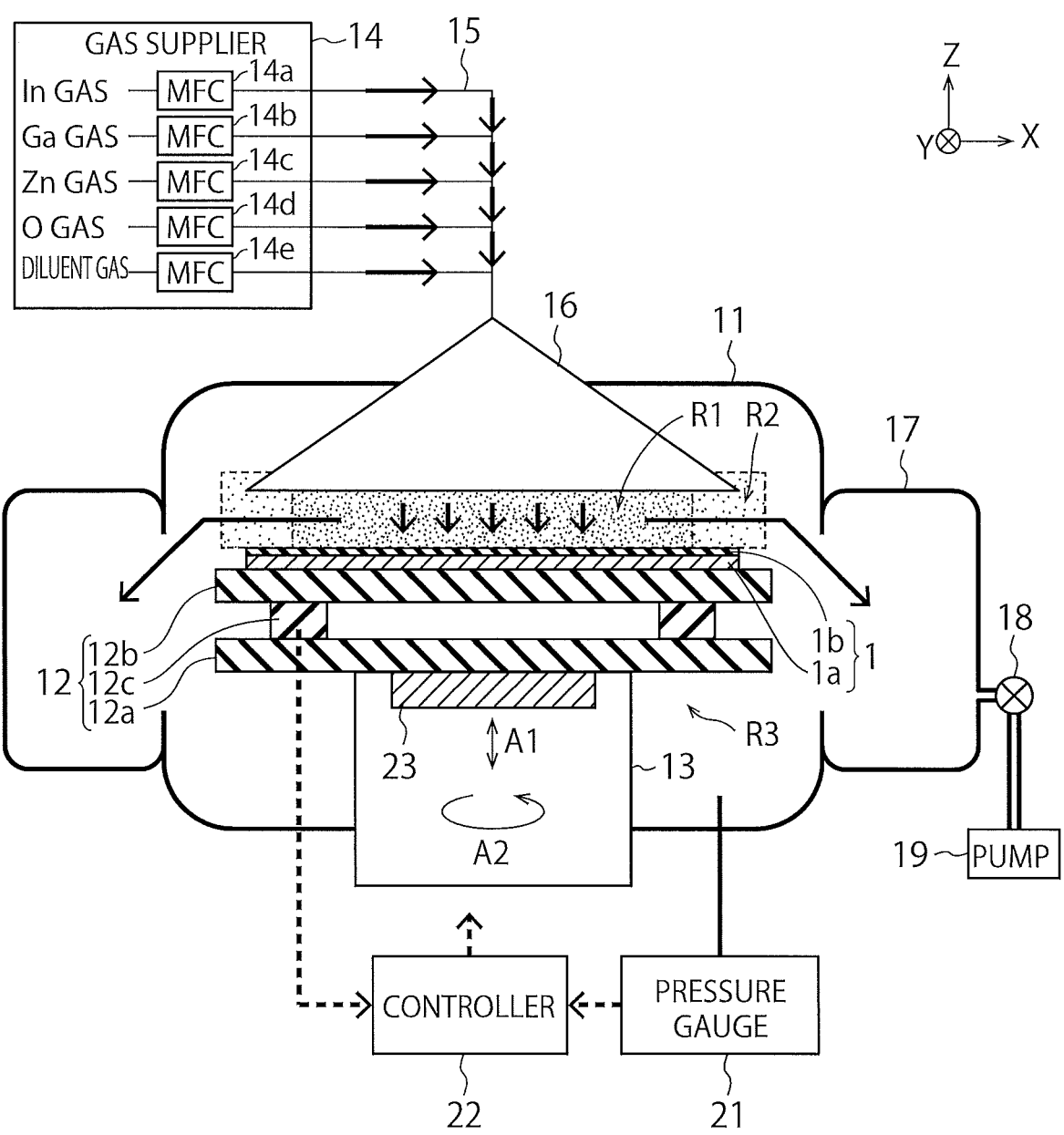
FIG. 1 is a schematic view illustrating the configuration of a CVD apparatus of a first embodiment.

FIG. 1 is a schematic view illustrating the configuration of a CVD apparatus of a first embodiment. The CVD apparatus in FIG. 1 is an ALD (Atomic Layer Deposition) apparatus, for example. The CVD apparatus in FIG. 1 is an example of a film forming apparatus.

The CVD apparatus of the present embodiment includes a chamber 11, a stage 12, a rotating shaft 13, a gas supplier 14, gas piping 15, a showerhead 16, an exhaust ring 17, a valve 18, a pump 19, a pressure gauge 21, a controller 22, and a height adjuster 23. The stage 12 includes a lower plate 12a, an upper plate 12b, and one or more piezoelectric devices 12c. The gas supplier 14 includes a plurality of MFCs (Mass Flow Controllers) 14a, 14b, 14c, 14d, and 14e. The lower plate 12a is an example of a first member, and the upper plate 12b is an example of a second member. The piezoelectric device(s) 12c is/are an example of a first detector, and the pressure gauge 21 is an example of a second detector.—

FIG. 1 illustrates the X-direction, the Y-direction, and the Z-direction that are perpendicular to each other. In this specification, the +Z-direction is handled as the upward direction, and the −Z-direction is handled as the downward direction. The −Z-direction may either coincide with or not coincide with the direction of gravity.

The chamber 11 loads a wafer 1. The wafer 1 illustrated in FIG. 1 includes a substrate 1a and a film 1b. The substrate 1a is a semiconductor substrate, such as a Si (silicon) substrate, for example. The film 1b is a CVD film formed on the substrate 1a using the CVD apparatus of the present embodiment, for example. The film 1b of the present embodiment is a metal film including a metal element and oxygen, for example, an IGZO film including In (indium), Ga (gallium), Zn (zinc), and O (oxygen). In the present embodiment, the wafer 1 including the substrate 1a is carried into the chamber 11, and the film 1b is formed on the substrate 1a in the chamber 11 by CVD, and then, the wafer 1 including the substrate 1a and the film 1b is carried out of the chamber 11. In the present embodiment, various processes, such as the formation of the film 1b on the substrate 1a, are performed, and then, the wafer 1 is divided (diced) into a plurality of chips so that a plurality of semiconductor devices are manufactured out of the wafer 1.

The stage 12 supports the wafer 1 in the chamber 11. The stage 12 includes the lower plate 12a, the one or more piezoelectric devices 12c provided on the lower plate 12a, and the upper plate 12b, supporting the wafer 1, provided on the piezoelectric device(s) 12c. In FIG. 1, the wafer 1 is put on the upper surface of the upper plate 12b. Each piezoelectric device 12c detects pressure applied to each piezoelectric device 12c, and outputs an electric signal that varies depending at least on the pressure. Each piezoelectric device 12c of the present embodiment detects a pressure difference between pressure of a portion above the stage 12 in the chamber 11 and pressure of a portion below the stage 12 in the chamber 11. The former portion is an example of a first portion, and the latter portion is an example of a second portion. The pressure difference is an example of a first value. Further details of the piezoelectric device(s) 12c will be described later.

The rotating shaft 13 is attached to the lower plate 12a of the stage 12, and supports the stage 12. The rotating shaft 13 can rotate the wafer 1 on the stage 12 by rotating the stage 12 in the direction indicated by an arrow A2.

The gas supplier 14 supplies a gas into the chamber 11. Accordingly, with the gas, the film 1b can be formed on the substrate 1a. The gas supplier 14 of the present embodiment supplies an In gas including In, a Ga gas including Ga, a Zn gas including Zn, an O gas including O, and a diluent gas. Accordingly, an IGZO film can be formed as the film 1b. The In gas, the Ga gas, and the Zn gas are examples of a first gas, and the O gas is an example of a second gas. The O gas is an $O_3$ (ozone) gas, for example. The diluent gas is a rare gas, for example. The MFCs 14a to 14e in the gas supplier 14 measure and control the flow rates of the In gas, the Ga gas, the Zn gas, the O gas, and the diluent gas, respectively.

The gas piping 15 couples the gas supplier 14 and the showerhead 16 together, and supplies a gas, which has been supplied from the gas supplier 14, to the showerhead 16.

The showerhead 16 supplies the gas from the gas piping 15 into the chamber 11. As illustrated in FIG. 1, the showerhead 16 is arranged above the stage 12 in the chamber 11. Accordingly, the gas sprayed from the showerhead 16 reaches the upper surface of the substrate 1a on the stage 12. Consequently, the film 1b is formed on upper surface of the substrate 1a.

The exhaust ring 17 is attached to the sidewall of the chamber 11, and discharges the gas in the chamber 11. The exhaust ring 17 is coupled to the pump 19 via the valve 18. When the pump 19 operates with the valve 18 in an open position, the gas in the chamber 11 is discharged to the exhaust ring 17.

The pressure gauge 21 detects pressure in the chamber 11. The pressure gauge 21 of the present embodiment detects pressure of a portion below the stage 12 in the chamber 11, and outputs a signal indicating the result of detection of the pressure. The portion is an example of the second portion as described above. In addition, the pressure is an example of a second value.

The controller 22 controls various operations of the CVD apparatus of the present embodiment. For example, the controller 22 receives the foregoing electric signal from each piezoelectric device 12c, and obtains from the electric signal a pressure difference ΔP between pressure Pa of the portion above the stage 12 and pressure Pb of the portion below the stage 12. The controller 22 also receives the foregoing signal from the pressure gauge 21, and obtains from the signal the pressure Pb of the portion below the stage 12. The controller 22 of the present embodiment calculates the pressure Pa of the portion above the stage 12 based on the obtained pressure difference ΔP and pressure Pb, and then controls a process of forming the film 1b on the substrate 1a (film forming process) based on the calculated pressure Pa. For example, the controller 22 controls the height of the stage 12 in forming the film 1b on the substrate 1a to a suitable height based on the calculated pressure Pa. This makes it possible to form the suitable film 1b on the substrate 1a. The controller 22 may also control the film-forming process based on the obtained pressure difference ΔP and pressure Pb without calculating the pressure Pa.

The height adjuster 23 is attached to the lower plate 12a of the stage 12, and adjusts the height of the stage 12. The height adjuster 23 can change the height of the wafer 1 on the stage 12 by changing the height of the stage 12 in the directions as indicated by an arrow A1. The height of the stage 12 may be adjustable with the rotating shaft 13 instead of the height adjuster 23, or adjustable with the height adjuster 23 and the rotating shaft 13. The controller 22 can control the height of the stage 12 by operating the height adjuster 23 and/or the rotating shaft 13.

Next, further details of the CVD apparatus of the present embodiment will be described with continued reference to FIG. 1.

FIG. 1 illustrates regions R1, R2, and R3 in the chamber 11. The regions R1 and R2 are roughly located between the upper surface of the stage 12 and the lower surface of the showerhead 16. The region R3 corresponds to other regions in the chamber 11. Specifically, the region R1 is located around the center of the stage 12 as seen in plan view, and the region R2 is located around the outer periphery of the stage 12 as seen in plan view. The regions R1 and R2 are located above the stage 12. Meanwhile, the region R3 includes a region below the stage 12, for example.

When the film 1b is formed on the substrate 1a with a gas from the gas supplier 14, the gas is mainly supplied to a region between the showerhead 16 and the stage 12. Accordingly, pressure in each of the regions R1 and R2 usually becomes higher than pressure in the region R3. Further, pressure in the region R1 usually becomes higher than pressure in the region R2. Consequently, pressure applied to the upper surface of the wafer 1 becomes higher than pressure applied to the lower surface of the wafer 1. Each piezoelectric device 12c of the present embodiment detects a pressure difference between the former pressure and the latter pressure. Specifically, each piezoelectric device 12c detects the pressure difference between the region R1 (or R2) and the region R3. Meanwhile, the pressure gauge 21 detects pressure in the region R3.

Pressure in each of the regions R1 and R2 has influence on the film quality of the film 1b and the process of forming the film 1b. Therefore, pressure in each of the regions R1 and R2 is desirably detected with high accuracy. However, when pressure in the chamber 11 is detected in the region R3 with the pressure gauge 21, pressure that is lower than pressure in each of the regions R1 and R2 is detected. Further, even when pressure in each of the regions R1 and R2 is attempted to be detected with the pressure gauge 21, it would be difficult to arrange the pressure gauge 21 in the regions R1 and R2. For example, when the pressure gauge 21 is arranged in the regions R1 and R2, it becomes difficult to form the film 1b on the substrate 1a at a position around the pressure gauge 21.

Therefore, the CVD apparatus of the present embodiment detects the pressure difference between the region R1 and the region R3 using each piezoelectric device 12c. This makes it possible to obtain information on the pressure in the region R1 from the detection result obtained with each piezoelectric device 12c. For example, it becomes possible to calculate the pressure in the region R1 based on the result of detection of the pressure difference between the region R1 and the region R3 and the result of detection of the pressure in the region R3. Each piezoelectric device 12c may detect pressure in the region R2 instead of pressure in the region R1.

The controller 22 of the present embodiment controls the height of the stage 12 based on the calculated pressure in the region R1. The height of the stage 12 is controlled so that pressure applied to the upper surface of the wafer 1 is maintained constant, for example. This makes it possible to form the film 1b on the substrate 1a under constant pressure. The height of the stage 12 may be determined based on any portion of the stage 12. The controller 22 of the present embodiment controls the height (i.e., the Z-coordinate) of the upper surface of the stage 12 based on the calculated pressure in the region R1.

The film 1b of the present embodiment is a metal film including a metal element and oxygen, for example, an IGZO film including In, Ga, Zn, and O. In such a case, there are problems that pressure in each of the regions R1 and R2 has influence on the efficiency of adsorption that occurs while the metal film is formed from a gas including the metal element, and that the degree of the influence differs depending on the type of the metal element. The present embodiment makes it possible to suppress such problems by maintaining pressure applied to the upper surface of the wafer 1 constant.

When the film 1b is formed by CVD, such as ALD, it is often the case that the flow rate of a gas changes greatly, and therefore, pressure in each of the regions R1 and R2 changes greatly. The present embodiment makes it possible to favorably perform CVD by maintaining pressure applied to the upper surface of the wafer 1 constant. Further, when CVD is performed, a CVD film may be formed at a portion around the inlet of the chamber 11 (i.e., loading effect). In the present embodiment, the formation of such a CVD film may be suppressed by maintaining pressure applied to the upper surface of the wafer 1 at suitable pressure.

The control target of the controller 22 may be a target other than the height of the stage 12. For example, the controller 22 may control the flow rate of a gas supplied from the gas supplier 14 based on the calculated pressure in the region R1. This makes it possible to maintain pressure applied to the upper surface of the wafer 1 constant as in the case where the height of the stage 12 is controlled. However, pressure applied to the upper surface of the wafer 1 can be controlled more easily based on the height of the stage 12 than based on the flow rate of a gas. Further, when pressure applied to the upper surface of the wafer 1 is increased based on the flow rate of a gas, the consumption of an expensive gas is increased. Accordingly, usually, pressure applied to the upper surface of the wafer 1 is preferably controlled based on the height of the stage 12.

The detection of the pressure difference by each piezoelectric device 12c may be performed while the film 1b is formed on the substrate 1a, or may be performed in advance before the film 1b is formed on the substrate 1a. In the latter case, the film 1b is formed on the substrate 1a as a pre-process before the film 1b is formed on the substrate 1a as the actual process. During the pre-process, each piezoelectric device 12c detects the pressure difference in each individual step. In the actual process, the controller 22 controls the height of the stage 12 in the individual step based on the pressure difference detected during the pre-process. For example, the height of the stage 12 in a step A, a step B, and a step C of the actual process is controlled based on the result of detection of the pressure difference in a step A, a step B, and a step C of the pre-process, respectively. The result of detection of the pressure difference obtained in the pre-process is stored in a storage of the controller 22 for use in the actual process, for example.

When such a pre-process is adopted, performing the pre-process through simulation is also conceivable. However, it would be difficult to calculate changes in the pressure in the chamber 11 through simulation. Therefore, it is desirable that the pre-process of the present embodiment be actually performed using the CVD apparatus of the present embodiment.

Figure 2:
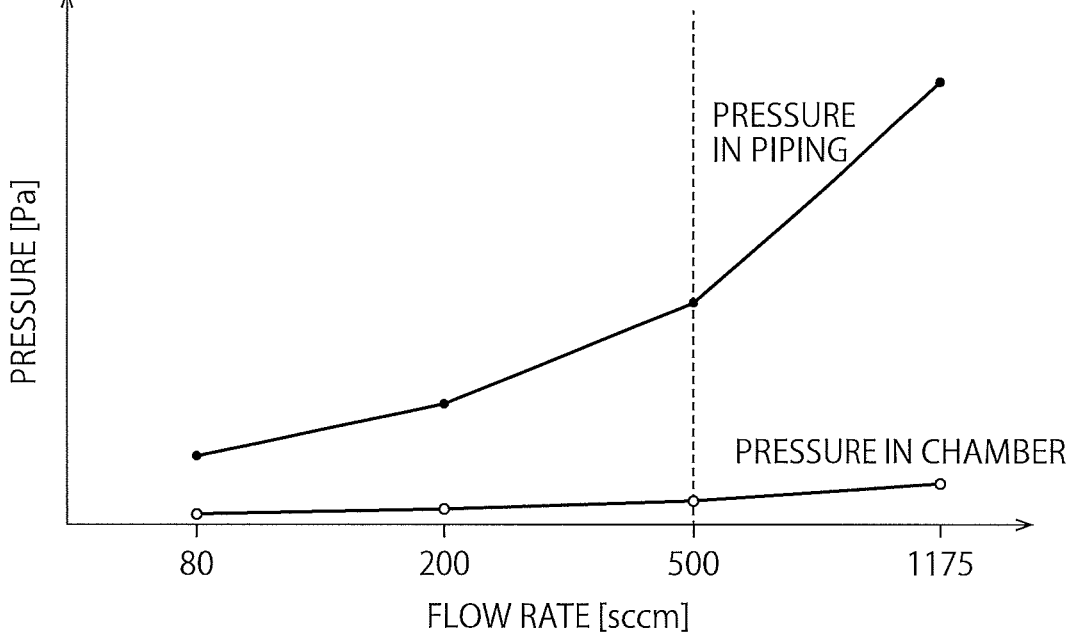
FIG. 2 is a graph for illustrating the operation of the CVD apparatus of the first embodiment.

FIG. 2 is a graph for illustrating the operation of the CVD apparatus of the first embodiment.

The horizontal axis of FIG. 2 represents the flow rate of a diluent gas measured with the MFC 14e. The vertical axis of FIG. 2 represents the pressure of the diluent gas. FIG. 2 illustrates the pressure of the diluent gas in the piping 15 and the pressure of the diluent gas in the chamber 11 (i.e., the region R1) when the diluent gas is supplied into the chamber 11 from the gas supplier 14.

According to FIG. 2, it is found that as the flow rate of the diluent gas is higher, the difference between the pressure of the diluent gas in the piping 15 and the pressure of the diluent gas in the chamber 11 becomes greater. This indicates that provided that a measured value obtained with a pressure gauge provided in the piping 15 is regarded as pressure in the chamber 11, an error between the actual pressure in the chamber 11 and the measured value becomes larger. Accordingly, it would be difficult to measure pressure in the chamber 11 with high accuracy with the pressure gauge provided in the piping 15. Such an error becomes larger as the flow rate of the diluent gas is higher, and becomes prominent when the flow rate of the diluent gas is greater than or equal to 500 sccm, for example. This is also true of a case where a gas other than the diluent gas is supplied.

Accordingly, the CVD apparatus of the present embodiment measures pressure in the chamber 11 (i.e., the region R1) using the piezoelectric device(s) 12c in the chamber 11. This allows for highly accurate measurement of pressure.

Figure 3A:
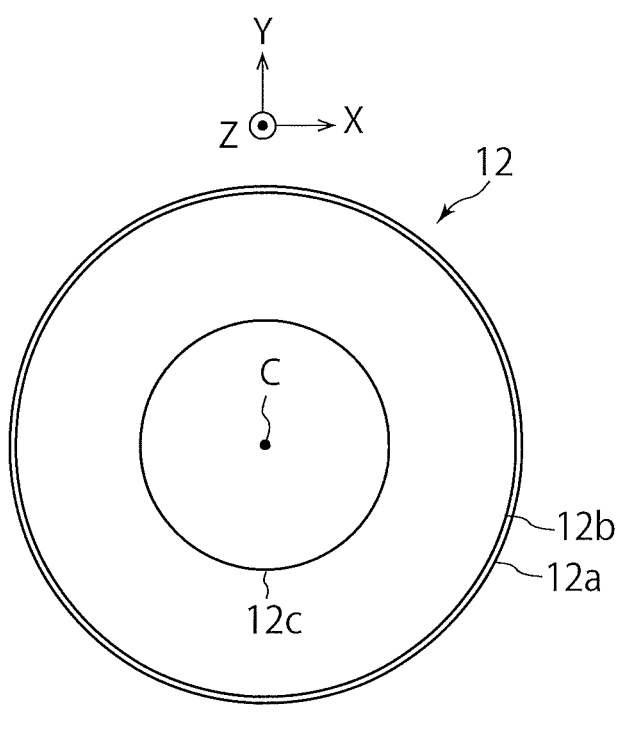
FIGS. 3A and 3B are plan views for illustrating the configuration of the CVD apparatus of the first embodiment.
Figure 3B:
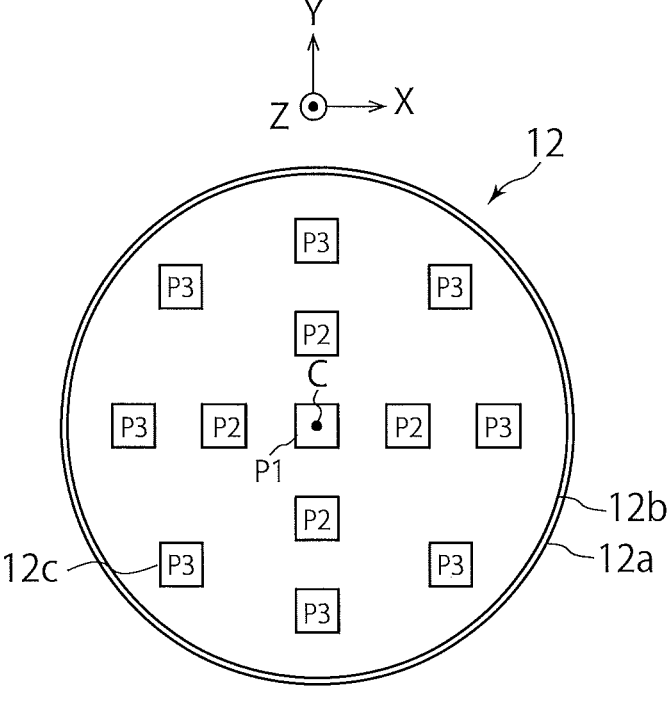

FIGS. 3A and 3B are plan views for illustrating the configuration of the CVD apparatus of the first embodiment.

FIG. 3A illustrates a first example of the stage 12 of the present embodiment. The stage 12 of the present example includes a single piezoelectric device 12c between the lower plate 12a and the upper plate 12b. The piezoelectric device 12c is arranged at a position overlapping a center C of the stage 12. The controller 22 in such a case controls the height of the stage 12 based on the pressure difference detected with the piezoelectric device 12c.

FIG. 3B illustrates a second example of the stage 12 of the present embodiment. The stage 12 of the present example includes a plurality of piezoelectric devices 12c between the lower plate 12a and the upper plate 12b. The piezoelectric devices 12c are arranged at a distance from each other, and detect pressure differences at different positions to each other. The controller 22 in such a case controls the height of the stage 12 based on the pressure differences detected with the piezoelectric devices 12c. For example, the height of the stage 12 is controlled based on a mean or a distribution of the pressure differences detected with the piezoelectric devices 12c. The mean of the pressure differences may be either a mean of frequency distributions or a weighted mean.

The piezoelectric devices 12c in FIG. 3B include one piezoelectric device P1 arranged at the center C, four piezoelectric devices P2 arranged around the center C, and eight piezoelectric devices P3 arranged far from the center C. For example, the four piezoelectric devices P2 are provided concentrically around the center C, and the eight piezoelectric devices P3 are provided concentrically around the center C. The controller 22 may control the height of the stage 12 based on the pressure difference detected with the piezoelectric device P1, a mean of the pressure differences detected with the piezoelectric devices P2, and a mean of the pressure differences detected with the piezoelectric devices P3, for example.

Figure 4:
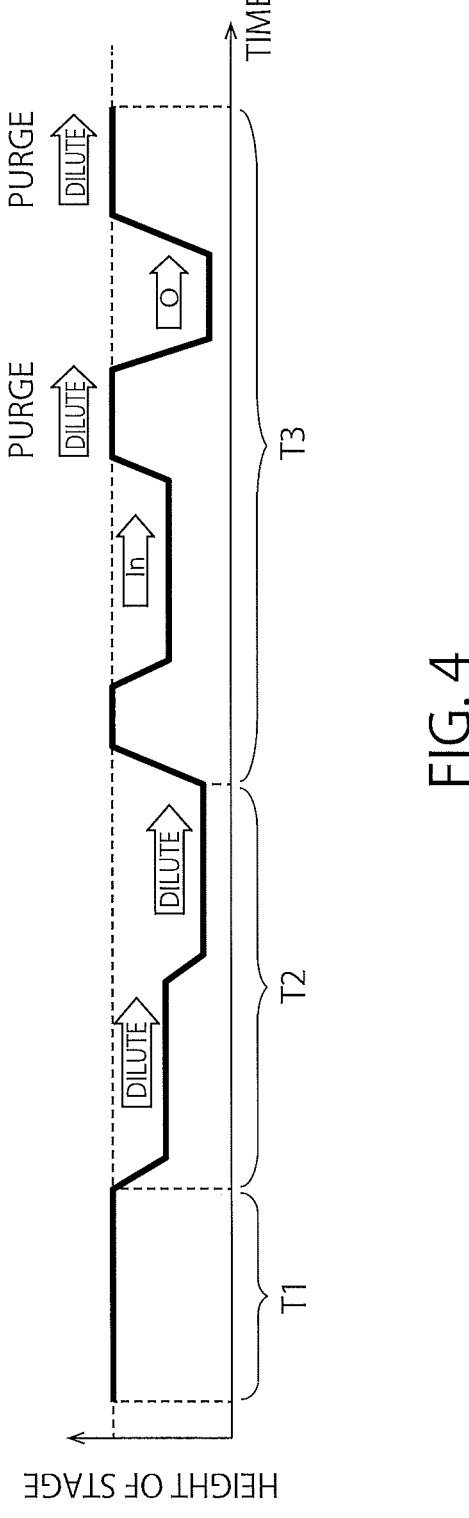
FIG. 4 is a sequence diagram for illustrating the operation of the CVD apparatus of the first embodiment.

FIG. 4 is a sequence diagram for illustrating the operation of the CVD apparatus of the first embodiment. FIG. 4 illustrates changes in the height of the stage 12 with time.

In a period T1, the controller 22 performs an operation of starting up the CVD apparatus. When the start-up operation is performed, the height of the stage 12 is maintained constant (i.e., a standby state). In FIG. 4, the height of the stage 12 in the standby state is indicated by dashed lines.

In a period T2, the controller 22 performs a pre-sequence of inspecting the correspondence between the pressure difference detected with the piezoelectric device(s) 12c and the height of the stage 12. The pre-sequence may be performed by supplying a gas to form the film 1b on the substrate 1a, or simply by supplying a gas. In the latter case, the pre-sequence may be performed by supplying only a diluent gas. FIG. 4 illustrates an example of a pre-sequence performed by supplying only a diluent gas.

In a period T3, the controller 22 performs a sequence of forming the film 1b on the substrate 1a. The period T3 illustrated in FIG. 4 includes a period for supplying an In gas, a period for supplying a diluent gas, a period for supplying an O gas, and a period for supplying a diluent gas in this order. Accordingly, a layer including In and O is formed as part of the film 1*b*. Similarly, a further process in the period T3 is performed to include a period for supplying a Ga gas, a period for supplying a diluent gas, a period for supplying an O gas, and a period for supplying a diluent gas in this order. Accordingly, a layer including Ga and O is formed as part of the film 1*b*. Similarly, a further process in the period T3 is performed to include a period for supplying a Zn gas, a period for supplying a diluent gas, a period for supplying an O gas, and a period for supplying a diluent gas in this order. Accordingly, a layer including Zn and O is formed as part of the film 1*b*. As such layers are alternately formed repeatedly, an IGZO film is formed as the film 1*b*.

In the period T3, the controller 22 controls the height of the stage 12 using the correspondence obtained in the period T2. This makes it possible to control the height of the stage 12 in forming the film 1*b* on the substrate 1*a* to a suitable height, and form the suitable film 1*b* on the substrate 1*a*. When the diluent gas is supplied (i.e., a purge period) in the period T3, the height of the stage 12 is returned to the height in the standby state.

Figure 5:
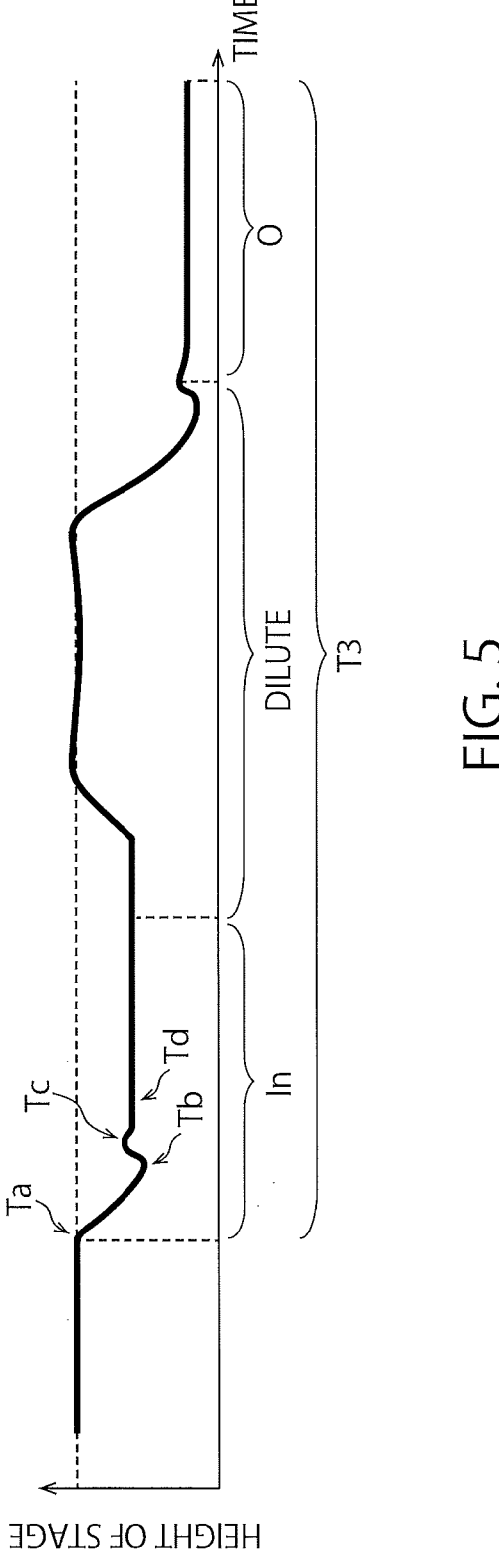
FIG. 5 is another sequence diagram for illustrating the operation of the CVD apparatus of the first embodiment.

FIG. 5 is another sequence diagram for illustrating the operation of the CVD apparatus of the first embodiment.

FIG. 5 illustrates a case where the film 1*b* is formed in the period T3 without the pre-sequence in the period T2 of FIG. 4 performed. The supply of an In gas is started at a time Ta. The controller 22 gradually lowers the height of the stage 12 after the supply of the In gas is started. In FIG. 5, the height of the stage 12 is lowered from the time Ta to a time Tb, and is elevated from the time Tb to a time Tc, and is then maintained at an optimal height. At a time Td indicated in FIG. 5, the height of the stage 12 has already reached the optimal height. The height of the stage 12 may also be changed from the height at the time Ta to the height at the time Td without undergoing the changes at the times Tb and Tc.

After the supply of the In gas is started, the controller 22 determines the optimal height of the stage 12 based on the pressure difference detected with the piezoelectric device(s) 12*c*, and maintains the stage 12 at the optimal height. The supply of the In gas and the adjustment of the height of the stage are performed concurrently.

The operation illustrated in FIG. 5 is similarly performed when a Ga gas, a Zn gas, and an O gas are supplied. FIG. 5 illustrates changes in the height of the stage 12 when an O gas is supplied.

The sequence in FIG. 5 may be performed during the period T3 of FIG. 4. That is, the sequence in the period T3 of FIG. 5 may be performed after the pre-sequence in the period T2. It is also possible to adjust the height of the stage 12 concurrently with the supply of an In gas, for example, in addition to the pre-sequence. This allows for more accurate adjustment of the height of the stage 12.

As described above, in the CVD apparatus of the present embodiment, a pressure difference between pressure of a portion above the stage 12 and pressure of a portion below the stage 12 is detected with each piezoelectric device 12*c*, and a process of forming the film 1*b* on the substrate 1*a* (i.e., a film-forming process) is controlled based on the detected pressure difference. Accordingly, the present embodiment makes it possible to detect the internal state of the chamber 11 with high accuracy, and therefore form the suitable film 1*b* on the substrate 1*a*.

Second and Third Embodiments

Figure 6A:
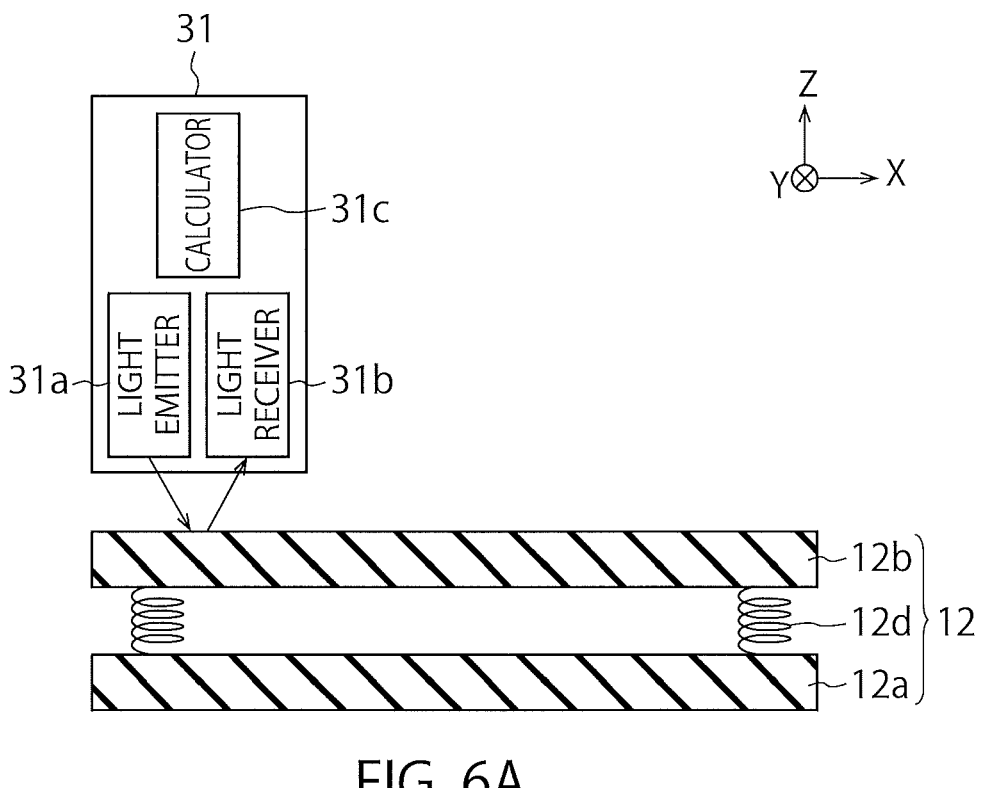
FIGS. 6A and 6B are schematic views respectively illustrating the configurations of CVD apparatuses of second and third embodiments.
Figure 6B:
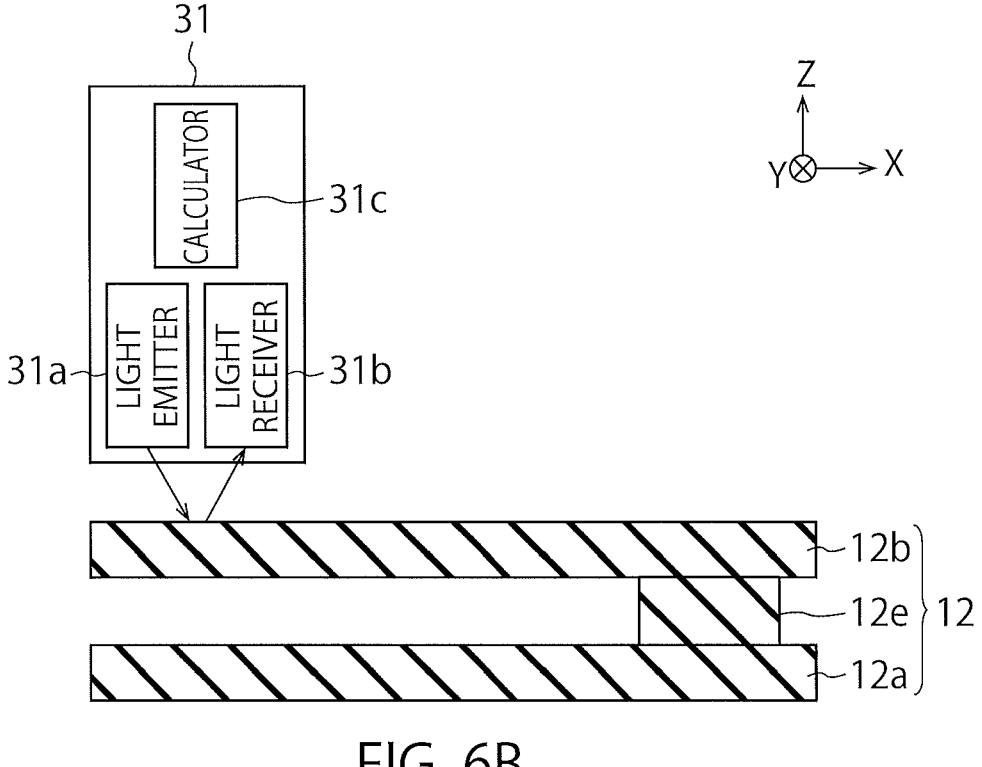

FIGS. 6A and 6B are schematic views respectively illustrating the configurations of CVD apparatuses of second and third embodiments.

FIG. 6A illustrates the stage 12 in the CVD apparatus of the second embodiment. The configuration of the CVD apparatus of the present embodiment is similar to the configuration of the CVD apparatus of the first embodiment. However, the stage 12 of the present embodiment includes one or more elastic members 12*d* instead of the one or more piezoelectric devices 12*c* between the lower plate 12*a* and the upper plate 12*b*. The CVD apparatus of the present embodiment also includes an optical sensor 31. The optical sensor 31 includes a light emitter 31*a*, a light receiver 31*b*, and an calculator 31*c*. The optical sensor 31 is an example of the first detector.

In the first embodiment, when pressure in the region R1 has become higher than pressure in the region R3 (FIG. 1), pressure applied to each piezoelectric device 12*c* changes. The controller 22 of the first embodiment can obtain from an electric signal received from each piezoelectric device 12*c* a pressure difference between the pressure in the region R1 and the pressure in the region R3. The controller 22 of the first embodiment controls the height of the stage 12 based on the obtained pressure difference.

Meanwhile, in the present embodiment, when pressure in the region R1 has become higher than pressure in the region R3, the height of the stage 12 changes. This is because the width of a gap between the lower plate 12*a* and the upper plate 12*b* changes due to the action of the elastic member(s) 12*d*. The optical sensor 31 optically detects the height of the stage 12, and outputs a signal indicating the result of detection of the height of the stage 12. The controller 22 of the present embodiment can obtain the current height of the stage 12 from the signal received from the optical sensor 31. The controller 22 of the present embodiment controls the height of the stage 12 based on the obtained height. The optical sensor 31 or the controller 22 may calculate the foregoing pressure difference from the height detected with the optical sensor 31, and the controller 22 may perform control similar to the control in the first embodiment using the pressure difference.

In the optical sensor 31, the light emitter 31*a* emits a laser beam toward the upper plate 12*b*. The laser beam is reflected by the upper surface of the upper plate 12*b*. The light receiver 31*b* receives the laser beam reflected by the upper plate 12*b*. The calculator 31*c* calculates the height of the stage 12 based on the result of reception of the laser beam. The CVD apparatus of the present embodiment may include a plurality of optical sensors 31 that detect the height of the stage 12 at a plurality of positions. Alternatively, the CVD apparatus of the present embodiment may include one or more sensors that detect the height of the stage 12 in a non-optical manner.

FIG. 6B illustrates the stage 12 in the CVD apparatus of the third embodiment. The configuration of the CVD apparatus of the present embodiment is similar to the configuration of the CVD apparatus of the second embodiment. However, the stage 12 of the present embodiment includes a support member 12*e* instead of the one or more elastic members 12*d* between the lower plate 12*a* and the upper plate 12*b*.

In the present embodiment, the upper plate 12*b* is provided in a cantilever state on the support member 12*e*. Accordingly, when pressure in the region R1 has become higher than pressure in the region R3, the height of the stage 12 locally changes due to the elastic action of the cantilever. The optical sensor 31 of the present embodiment optically detects the height of the stage 12, and outputs a signal indicating the result of detection of the height of the stage 12 as in the second embodiment. The following processes are similar to those in the second embodiment.

According to the second or third embodiment, it is possible to detect the internal state of the chamber 11 with high accuracy, and therefore form the suitable film 1*b* on the substrate 1*a* as in the first embodiment.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A film forming apparatus comprising:
a chamber configured to load a substrate;
a stage configured to support the substrate;
a gas supplier configured to supply a gas into the chamber to form a film on the substrate;
a first detector configured to detect a first value that varies depending on at least pressure of a first portion above the stage in the chamber and pressure of a second portion that is different from the first portion in the chamber, the second portion being located below the stage in the chamber; and
a controller configured to control a process of forming the film on the substrate based on the first value.

2. The apparatus of claim 1, wherein the controller controls a height of the stage based on the first value.

3. The apparatus of claim 1, wherein the first portion is located between the stage and a showerhead configured to supply the gas supplied from the gas supplier into the chamber.

4. The apparatus of claim 1, further comprising a second detector configured to detect a second value that varies depending on the pressure of the second portion,
wherein the controller controls the process of forming the film on the substrate based on the first value and the second value.

5. The apparatus of claim 4, wherein the second value is the pressure of the second portion.

6. The apparatus of claim 1, wherein the first value is a pressure difference between the pressure of the first portion and the pressure of the second portion.

7. The apparatus of claim 6, wherein the first detector includes at least one piezoelectric device configured to detect the pressure difference and output an electric signal that varies depending on the pressure difference.

8. The apparatus of claim 7, wherein the stage includes a first member, the at least one piezoelectric device provided on the first member, and a second member provided on the at least one piezoelectric device and configured to support the substrate.

9. The apparatus of claim 7, wherein the controller controls the process of forming the film on the substrate based on a plurality of first values detected at a plurality of first portions by a plurality of piezoelectric devices of the first detector.

10. The apparatus of claim 1, wherein the gas supplier supplies a first gas including a metal element and a second gas including oxygen to form the film including the metal element and oxygen.

11. A film forming apparatus, comprising:
a chamber configured to load a substrate;
a stage configured to support the substrate;
a gas supplier configured to supply a gas into the chamber to form a film on the substrate;
a first detector configured to detect a first value that varies depending on at least pressure of a first portion above the stage in the chamber; and
a controller configured to control a process of forming the film on the substrate based on the first value,
wherein the first detector optically detects a height of the stage.

12. The apparatus of claim 11, wherein the stage includes a first member, an elastic member provided on the first member, and a second member provided on the elastic member and configured to support the substrate.

13. The apparatus of claim 11, wherein the stage includes a first member, a support member provided on the first member, and a second member provided on the support member in a cantilever state and configured to support the substrate.

14. A method of manufacturing a semiconductor device, comprising:
loading a semiconductor substrate in a chamber;
supporting the semiconductor substrate on a stage;
detecting, by a first detector, a first value that varies depending on at least pressure of a first portion above the stage in the chamber, and pressure of a second portion that is different from the first portion in the chamber, the first value being a pressure difference between the pressure of the first portion and the pressure of the second portion; and
controlling, by a controller, a process of supplying a gas into the chamber from a gas supplier to form a film on the semiconductor substrate based on the first value.

15. The method of claim 14, wherein the first detector includes at least one piezoelectric device configured to detect the pressure difference and output an electric signal that varies depending on the pressure difference.

16. The method of claim 15, wherein the stage includes a first member, the at least one piezoelectric device provided on the first member, and a second member provided on the at least one piezoelectric device and configured to support the semiconductor substrate.

\* \* \* \* \*